US005580795A

United States Patent [19]

Schimert et al.

[11] Patent Number: 5,580,795
[45] Date of Patent: Dec. 3, 1996

[54] FABRICATION METHOD FOR INTEGRATED STRUCTURE SUCH AS PHOTOCONDUCTIVE IMPEDANCE-MATCHED INFRARED DETECTOR WITH HETEROJUNCTION BLOCKING CONTACTS

[75] Inventors: Thomas R. Schimert, Ovilla; Scott L. Barnes, Arlington, both of Tex.

[73] Assignee: Loral Vought Systems Corporation, Grand Prairie, Tex.

[21] Appl. No.: 389,549

[22] Filed: Feb. 15, 1995

Related U.S. Application Data

[63] Continuation of Ser. No. 104,983, Aug. 10, 1993, abandoned.

[51] Int. Cl.[6] .......................... H01L 31/18; H01L 25/00; H01L 31/00
[52] U.S. Cl. .............................. 437/5; 437/974; 250/332; 257/442
[58] Field of Search .................................. 437/3, 5, 974; 257/442; 250/332, 338.4

[56] References Cited

U.S. PATENT DOCUMENTS

| | | | |
|---|---|---|---|
| 3,452,198 | 6/1969 | White | 250/338.4 |
| 3,575,740 | 4/1971 | Castrucci et al. | |
| 3,884,733 | 5/1975 | Bean | 437/3 |
| 4,050,979 | 9/1977 | Smeltzer et al. | 437/974 |
| 4,355,456 | 10/1982 | Harnagel et al. | 29/572 |
| 4,380,056 | 4/1983 | Parrish et al. | 365/183 |
| 4,512,847 | 4/1985 | Brunsch et al. | 156/626 |
| 4,533,933 | 8/1985 | Pellegrini et al. | 357/15 |
| 4,720,738 | 1/1988 | Simmons | 357/30 |
| 4,782,028 | 11/1988 | Farrier et al. | 437/3 |
| 4,783,594 | 11/1988 | Schulte et al. | 250/332 |
| 4,901,084 | 2/1990 | Huguenin et al. | 342/179 |
| 4,910,154 | 3/1990 | Zanio et al. | 437/5 |
| 4,914,296 | 4/1990 | Reinhold et al. | 250/330 |
| 4,956,555 | 9/1990 | Woodberry | 250/339 |
| 4,965,649 | 10/1990 | Zanio et al. | 357/30 |
| 4,970,567 | 11/1990 | Ahlgren et al. | 357/30 |
| 5,081,063 | 1/1992 | Vonno et al. | 437/180 |
| 5,091,330 | 2/1992 | Cambou et al. | 437/974 |

(List continued on next page.)

FOREIGN PATENT DOCUMENTS

| 8304456 | 12/1983 | WIPO . |
| 9002419 | 3/1990 | WIPO . |

OTHER PUBLICATIONS

D. K. Arch, R. A. Wood and D. L. Smith, "High Responsivity HgCdTe Heterojunction Photoconductor", J. Appl. Phys. 58, pp. 2360–2370 (1985).

P. R. Norton, "Infrared image sensors", *Optical Engineering*, Nov. 1991, vol. 30 No. 11, pp. 1649–1663.

D. L. Spears and P. E. Duffy, "HgCdTe Resonant–Optical–Cavity Infrared Detectors", Proc. IRIS Detector, 1985, vol. II, pp. 95–122.

*Primary Examiner*—Mary Wilczewski
*Assistant Examiner*—Brian K. Dutton
*Attorney, Agent, or Firm*—Richards, Medlock & Andrews

[57] ABSTRACT

A photoconductive isotype heterojunction impedance-matched infrared detector has blocking contacts which are positioned on the bottom side of the detector. The blocking contacts prevent transfer of minority carriers from the active region of the detector, thereby extending the lifetime of these carriers. The detector is formed by first fabricating an active layer followed by an isotype blocking layer on a growth substrate. These layers are etched and appropriate passivation layers and contacts are applied. A mechanical supporting substrate is applied to the detector and the growth substrate is removed. Etch stop holes are formed which extend into the active layer of the detector. A precision thickness of the active layer required in an impedance-matched detector design is produced by thinning the active layer in an etching process until the surface of the active layer reaches the etch stop hole. The detector produced in accordance with the structure and methods set forth herein is highly suitable for use in an array of such detectors which can form an infrared focal plane array.

5 Claims, 5 Drawing Sheets

U.S. PATENT DOCUMENTS

| | | | |
|---|---|---|---|
| 5,109,158 | 4/1992 | Horne | 250/332 |
| 5,122,669 | 6/1992 | Herring et al. | 250/370.14 |
| 5,132,761 | 7/1992 | York et al. | 357/30 |
| 5,132,763 | 7/1992 | Maserjian | 357/30 |
| 5,145,795 | 9/1992 | Sanders et al. | 437/974 |
| 5,179,283 | 1/1993 | Cockrum et al. | 250/352 |
| 5,385,632 | 1/1995 | Goossen | 437/5 |

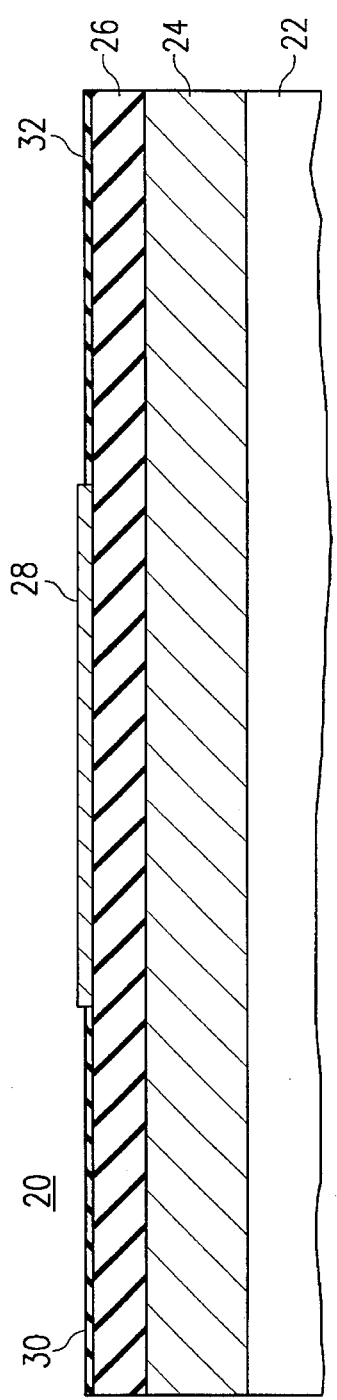
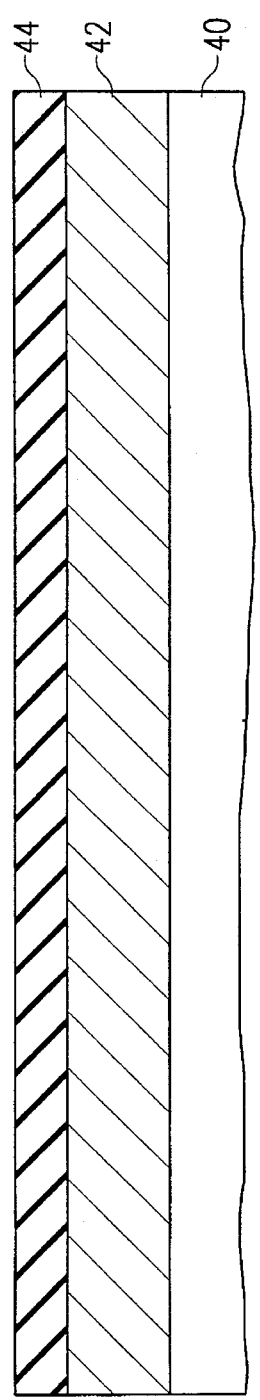
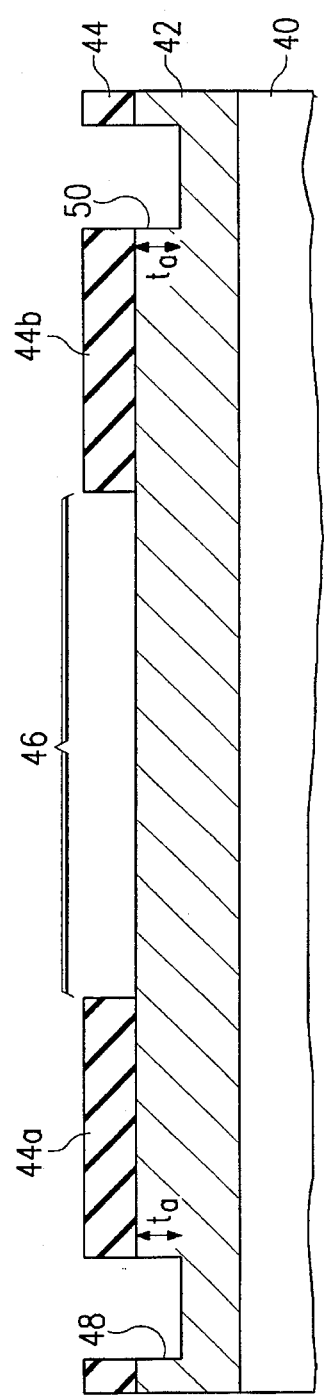
FIG. 1 (PRIOR ART)
FIG. 2a
FIG. 2b

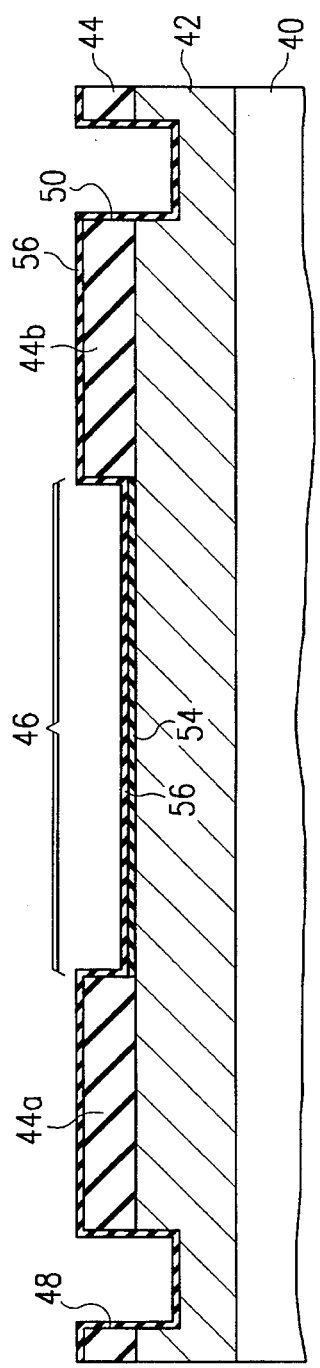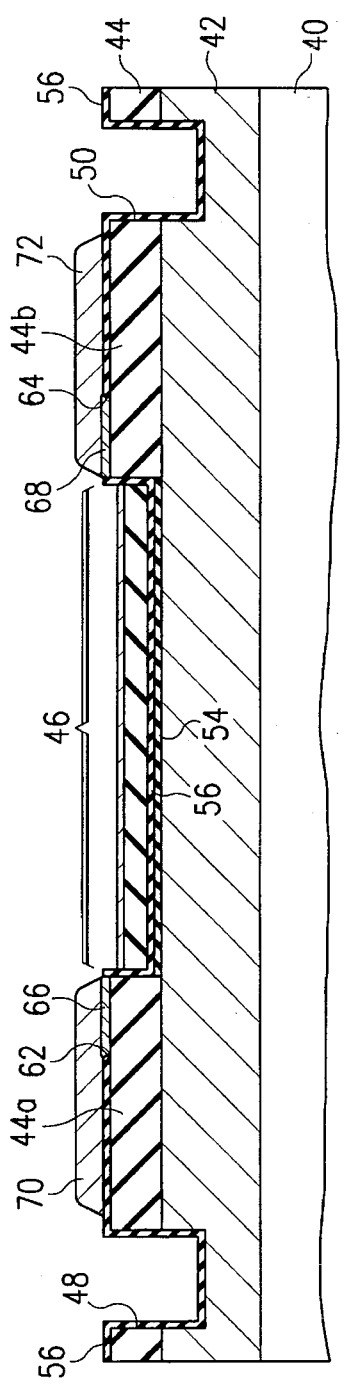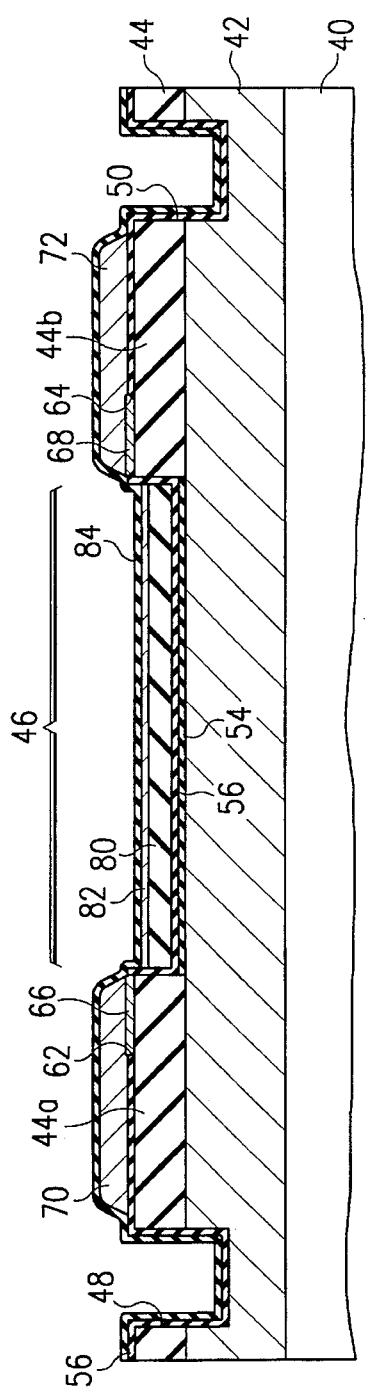

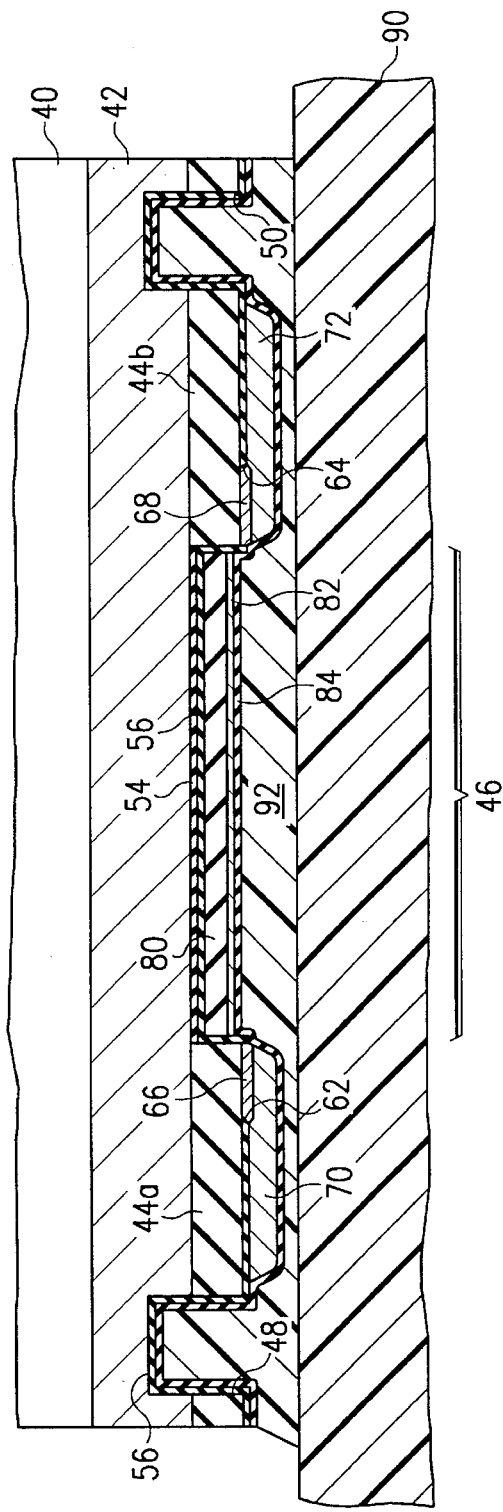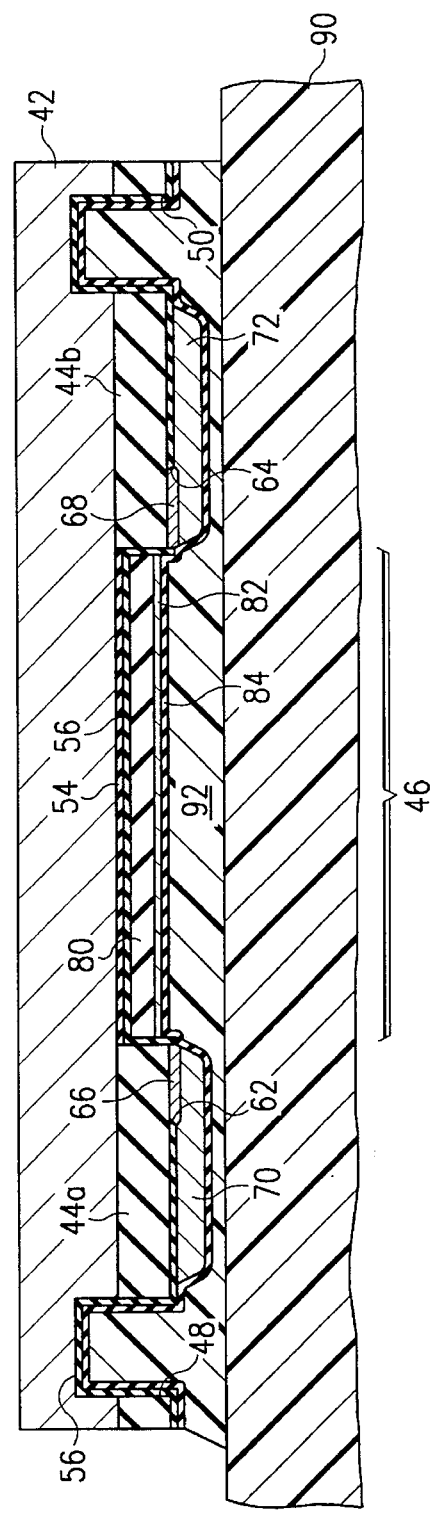

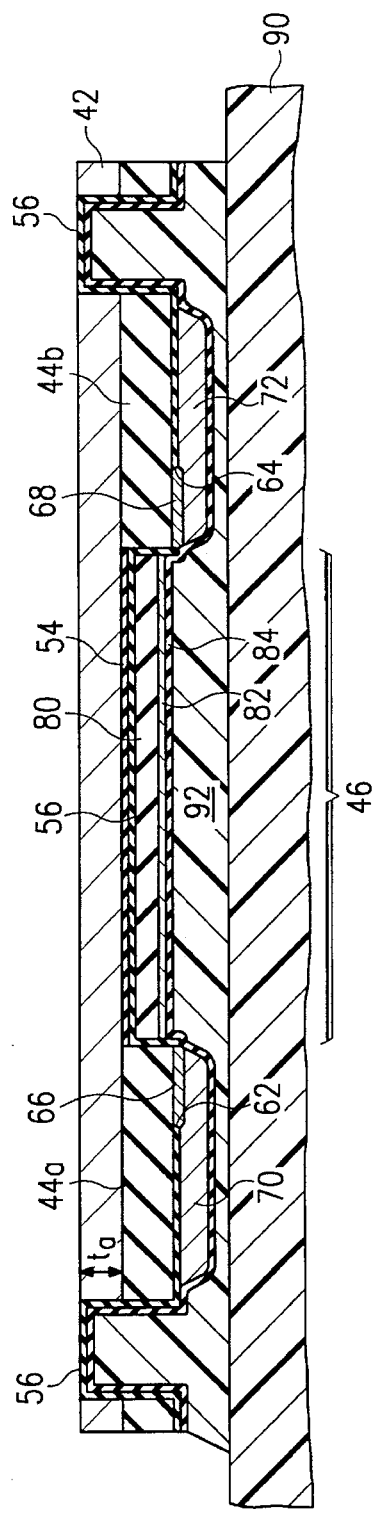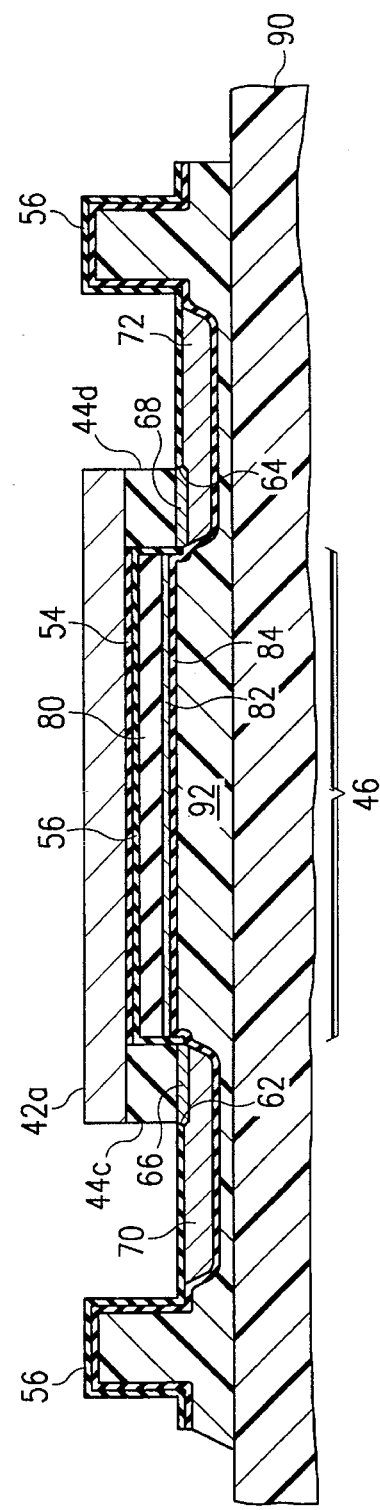

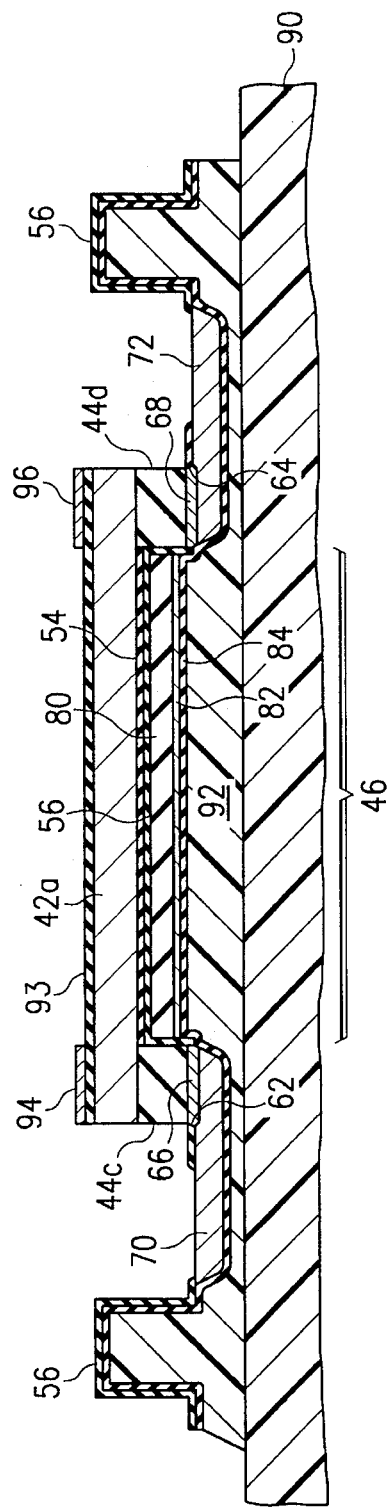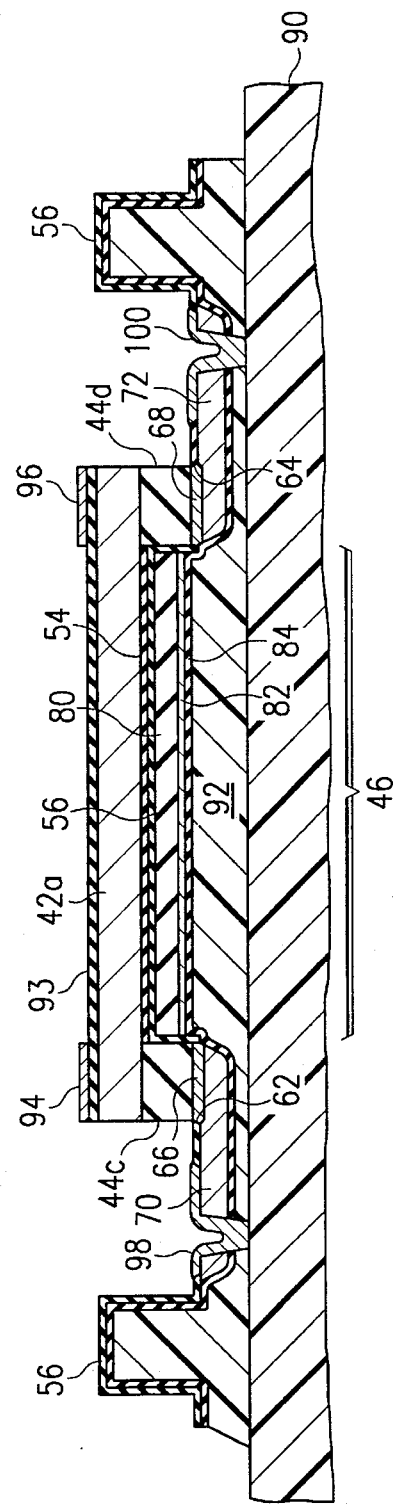

FABRICATION METHOD FOR INTEGRATED STRUCTURE SUCH AS PHOTOCONDUCTIVE IMPEDANCE-MATCHED INFRARED DETECTOR WITH HETEROJUNCTION BLOCKING CONTACTS

This is a continuation of U.S. patent application Ser. No. 08/104,983, filed Aug. 10, 1993, now abandoned.

FIELD OF THE INVENTION

The present invention pertains in general to photoconductive infrared detectors and in particular to the structure and fabrication of such detectors which have heterojunction blocking contacts.

BACKGROUND OF THE INVENTION

A serious problem encountered in the operation of photoconductive infrared detectors is that of "sweep-out". This is the transfer of minority carriers from an active material to a contact, due to an applied electric field, in a time which is substantially less than the normal lifetime of these carriers. This reduced lifetime of the carriers degrades the effectiveness of the detector. Sweep-out is a chronic problem with most P-type detector materials with high ambipolar mobility and is becoming a greater problem with high performance N-type detector materials. It has been recognized that the problem of sweep-out can be reduced by the use of an isotype heterojunction between the active material and the contact to block the transfer of the minority carriers. However, there are serious problems in the design and fabrication of isotype heterojunctions to produce effective impedance-matched photoconductive infrared detectors.

In an impedance-matched infrared photoconductive (IMPC) detector the thickness of the active absorbing material is significantly less than the absorption depth, i.e., the depth over which the incident radiation is absorbed. To maintain high quantum efficiency, an impedance-matching substructure which normally consists of a dielectric multilayer spacer region and a high reflectivity groundplane is required. The active absorbing layer together with the impedance-matching substructure make up an optical cavity which traps the incident radiation allowing it to be completely absorbed in the active layer. In this way the quantum efficiency of an IMPC detector can be made comparable to a conventional photoconductor in which the thickness of the active material is comparable to the absorption depth of the incident radiation. A reduction in active material volume while maintaining high quantum efficiency leads to improved signal-to-noise. Examples of active layer alternatives include, but are not limited to, epilayer mercury cadmium telluride, epilayer indium antimonide, epilayer indium antimonide arsenide, epilayer gallium indium antimonide, superlattice indium antimonide/indium antimonide arsenide and superlattice indium arsenide/gallium indium antimonide.

In an isotype heterojunction blocking contact, a wider bandgap isotype semiconductor layer is grown epitaxially on the active layer with its characteristic bandgap energy. An example of a heterostructure blocking contact in a long wavelength infrared (LWIR) mercury cadmium telluride conventional photoconductive detector is described in "High Responsivity HgCdTe Heterojunction Photoconductor" by D. K. Arch, R. A. Wood and D. L. Smith in *Journal of Applied Physics*, Vol. 58 at pages 2360–2370 (1985).

Precise control of layer thickness is important for optimum performance of an impedance-matched photoconductive infrared detector. The present invention provides a structure which allows precise control of the layer thickness in a IMPC with the inclusion of an isotype heterojunction blocking contact and a method of fabrication for such a detector.

SUMMARY OF THE INVENTION

A selected embodiment of the present invention is a method of fabrication for an impedance-matched photoconductive infrared detector. This method includes the step of forming an infrared active layer which is supported by a growth substrate followed by forming a carrier blocking layer on a first surface of the surface of the active layer. The blocking layer is etched to expose a detector region of the active layer and also to form first and second regions of the blocking layer on opposite sides of the detector region. A passivation layer is formed on the exposed surfaces of the blocking layer regions and on the detector region of the active layer. The passivation layer is etched to form respective openings in the first and second blocking layer regions. Ohmic contacts are formed which extend through the openings to the first and second blocking layer regions. Interconnect metallizations are formed over the contacts and extend laterally from the device area. A transparent spacer layer is formed over the detector region. A ground plane is formed over the surface of the spacer layer. A supporting substrate is joined to the ground plane, ohmic contacts and interconnect metallizations followed by removal of the growth substrate to expose a second surface of the active layer. The second surface of the active layer is etched to produce a predetermined thickness for the active layer.

A further embodiment of the present invention is an impedance-matched photoconductive infrared detector which comprises a supporting substrate having first and second planar offset ohmic contacts joined to the supporting substrate. First and second carrier blocking regions are positioned respectively on the surfaces of the ohmic contacts opposite the supporting substrate. A ground plane is positioned laterally between and below surfaces of the first and second blocking region surfaces where these surfaces are opposite the ohmic contacts. A dielectric spacer layer is positioned over the surface of the ground plane and is located at least partially between the first and second blocking regions. An infrared active layer is positioned at least partially on the surfaces of the blocking regions opposite said ohmic contacts. The active layer is in electrical contact with the blocking regions and the active layer is located on the opposite side of the dielectric spacer layer from the ground plane.

A still further aspect of the present invention is a method for fabricating a precision thickness layer of a selected material and an integrated structure. A first layer of the selected material is formed on a substrate. The first layer has a first surface adjacent the substrate and a second surface on the opposite side of the first layer from the substrate. A second layer is formed by the second material on the second surface of the first layer. An etch stop hole is formed by etching through the second layer and into the first layer for a predetermined depth into the first layer wherein the bottom of the etch stop hole is in the first layer. Next, the substrate is removed. Finally, the first surface of the first layer is etched to reduce the thickness of the first layer until the etched first surface becomes essentially parallel with the bottom of the etch stop hole. As a result of this etching operation, the first layer has a thickness which is essentially equal to the predetermined depth.

BRIEF DESCRIPTION OF THE DRAWINGS

For a more complete understanding of the present invention and the advantages thereof, reference is now made to the following description taken in conjunction with the accompanying drawings (not necessarily to scale) in which:

FIG. 1 is a sectional, elevation view of a prior art heterojunction photoconductive infrared detector, FIGS. 2a–2j are sectional, elevation views which illustrate sequential fabrication steps for producing a heterojunction photoconductive infrared detector in accordance with the present invention, and a sectional view of the completed detector is shown in FIG. 2j, and FIG. 2k is a sectional, elevation view of a second embodiment of a completed detector.

DETAILED DESCRIPTION OF THE INVENTION

A prior art infrared semiconductor detector 20 which has an isotype heterojunction is illustrated in FIG. 1. (See the Arch et al. article noted above). A substrate 22 supports an active layer 24 which has on the surface thereof a blocking layer 26. The substrate 22 can be, for example, a CdTe substrate. The active layer 24 is $Hg_{1-x}Cd_xTe$. This material has a value of x=0.2, where x is the proportion of Cd with respect to Hg. The blocking layer 26 is a similar material but having a value of x=0.24. This difference in value of x provides a difference in band gap energy which functions to block the transfer of minority carriers to the contact.

A passivation layer 28, comprising a material such as CdTe is provided at the center of detector 20. On each side of the passivation layer 28, there are provided contacts 30 and 32, which are, for example, titanium, electroless gold or HgTe. An ohmic connection is formed between the titanium, electroless gold or HgTe contact 30 and the blocking layer 26 as well as between the titanium or electroless gold contact 32 and the blocking layer 26.

The heterojunction structure presented in FIG. 1 does function to prevent the sweep-out of minority carriers and thereby increase the performance of the detector 20. However, this structure, and its method of fabrication, are not desirable in the manufacture of impedance-matched photoconductive detectors for use in focal plane arrays.

The steps in the manufacture of an impedance-matched photoconductive infrared detector with blocking contacts, in accordance with the present invention, are illustrated as sectional views in FIGS. 2a–2j. A sectional view of the final product in two embodiments is illustrated in FIGS. 2j and 2k. This infrared detector is designed to detect radiation in the spectral band of 8 to 12 microns.

Referring to FIG. 2a, fabrication is begun with a growth substrate 40 which is, for example, cadmium telluride (CdTe), cadmium zinc telluride (CdZnTe) or gallium arsenide (GaAs). An epitaxial isotype active layer 42 is grown on the surface of the growth substrate 40. The active layer 42 is an x=0.2 $Hg_{1-x}Cd_xTe$ epilayer having a thickness in the range of 2–10 μm. A blocking layer 44 is likewise epitaxially grown on the surface of the active layer 42. The blocking layer is preferably about 1 μm thick comprising x=0.24 $Hg_{1-x}Cd_xTe$ epilayer. The epilayers 42 and 44 are preferably grown by, for example, organo-metallic vapor phase epitaxy (OMVPE), molecular beam epitaxy (MBE), liquid phase epitaxy (LPE), or close-spaced vapor phase epitaxy (CSVPE). The combination of these growth techniques for the two layers can also be employed. The thickness of the layers are controlled through calibration in the growth process.

The next steps in the process are illustrated in FIG. 2b. The blocking layer 44 is etched from the upper surface of the active layer 42 to define a detector proper region 46. The layers 44 and 42 are also etched to form holes 48 and 50 which extend completely through the blocking layer 44 and for a distance (depth) $t_a$ into the active layer 42. The distance $t_a$ is the desired final thickness for the active layer 42, which, for the present embodiment is 0.6 microns.

The etching of the layer 44 produces blocking contact regions 44a and 44b which are on each side of the detector proper region 46. The etching of the layers 44 and 42 is preferably carried out using either a bromine ethylene glycol wet etch or free methyl plasma etching. The holes 48 and 50 are extended to a depth of $t_a$ into the active layer 42. The holes 48 and 50, which are subsequently used for etch stop determination, are shown to be adjacent to the detector proper region 46 only for the purpose of convenience of illustration. There need not be one of the holes 48 or 50 for each detector region 46. Typically, many hundreds or thousands of detector regions, such as 46, will be fabricated on a single wafer. Only a small number of the holes 48 and 50 need be provided throughout the entirety of the wafer.

Referring now to FIG. 2c, a passivation layer 54 is deposited and etched such that it covers the surface of the layer 42 in the detector region 46. The layer 54 is, for example, evaporated CdTe having a thickness of approximately 1,000 angstroms (A). Next, a silicon nitride etch stop layer 56 is deposited on all of the exposed surfaces. The SiN layer 56 has a preferable thickness of approximately 1,000 A. Note that the layer 56 also coats the interior surfaces, both sides and bottom, of the holes 48 and 50. The portion of layer 56 at the bottom of the holes 48 and 50 serves, as noted below, as an etch stop layer.

The next steps in the fabrication process of the detector are illustrated in FIG. 2d. The layer 56 is selectively etched on the surfaces of the regions 44a and 44b to form windows 62 and 64. The SiN layer 56 is wet etched by use of hydrofluoric acid or plasma etched by use of $CF_4$.

Further referring to FIG. 2d, contacts 66 and 68 are deposited using a conventional photolithographic liftoff process and are positioned respectively in the windows 62 and 64. Contacts 66 and 68 are metallization which, for mercury cadmium telluride, such as active layer 42, comprises titanium for n-type doped layer 42 and electroless gold or HgTe for p-type doping of layer 42. Following formation of the contacts 66 and 68, interconnecting metallization contacts 70 and 72 respectively are formed to electrically contact the contacts 66 and 68. The interconnect metallization is preferably evaporated titanium gold. Contacts 66 and 68 are preferably 500 A thick and metallization contacts 70 and 72 are preferably 10,000 A thick.

Referring now to FIG. 2e, there is described a portion of the fabrication sequence for producing a matching impedance structure. A spacer 80, comprising a dielectric material, is formed in the detector region 46 on the surface of the layer 56 between the blocking layer regions 44a and 44b. The spacer 80 is preferably made of CdTe or SiN. The thickness of the spacer 80 is carefully controlled so that the structure is tuned to the desired wavelength of infrared energy for reception. A metal ground plane 82, preferably evaporated aluminum, is deposited on the surface of the spacer 80. In the selected embodiment, the spacer 80 has a preferred thickness of 2000 Å and the aluminum ground plane 82 has a preferred thickness of 500 A. After formation of the ground plane 82, the entire structure is covered with a sealing dielectric layer 84 of, for example, SiN having a thickness of approximately 1,000 A.

Referring now to FIG. 2f, the structure shown in FIG. 2e has been inverted in the illustration for ease of description. A mechanical substrate 90 is bonded by use of epoxy 92 to join the substrate 90 to the structure shown in FIG. 2e. The epoxy 92 contacts the sealing layer 84. The substrate 90 is preferably a wafer of silicon or sapphire. Substrate 90 can also be a silicon read out integrated circuit (ROIC) chip.

Referring to FIG. 2g, the growth substrate 40 is removed by using an etch which is selective to the substrate 40. For the described substrate 40, any one of the three noted examples can be removed by a variety of acid-peroxide etches or E-etch. The E-etch can be performed by using potassium dichromate plus nitric acid and $H_2O$. These selectively etch the substrate 40 leaving the active layer 42 unetched.

The next step in the fabrication process is described in reference to FIG. 2h. This involves thinning of the active layer 42 to a precise design thickness $t_a$. The etching process uniformly removes the exposed surface of the layer 42 across the wafer. For the described active layer 42, the etching is carried out by, for example, bromine methanol wet etch or free methyl radical plasma etch. The etching process is continued until the upper surface of layer 56 appears. The surface of this layer is at the bottom of hole 48, as shown in FIG. 2c. An operator can terminate the etching process when the upper surface of layer 56 at hole 48 becomes visible or it can be detected by an instrument which stops the etching operation.

Referring to FIG. 2i, the active layer 42 and blocking layer 44 are patterned by selective etching by use of a conventional masking with a resist. The etching can be done by, for example, bromine ethylene glycol wet etch or free methyl radical plasma etch. This produces an active region 42a and blocking contact regions 44c and 44d.

As shown in FIG. 2j, a passivation layer 93 is formed on the surface of the active region 42a. This layer is preferably 1,000 A of CdTe. Aluminum light shield layers 94 and 96, having a thickness of approximately 500 A, are formed on the upper surface of the passivation layer 93. The shield layers 94 and 96 are aligned over the blocking regions 44c and 44d to prevent incident infrared radiation from striking the blocking regions 44c and 44d.

Respective bond pad windows are etched in the layer 56 over the contacts 70 and 72 to allow for external connections to the detector. This is done with a hydrofluoric acid wet etch or $CF_4$ plasma etch. Wire bonds can then be attached to the contacts 70 and 72.

A second embodiment of a detector cell is shown in FIG. 2k. In the case in which the supporting substrate 90 is a silicon ROIC, via holes are ion milled through contacts 70 and 72, sealing layer 84 and epoxy layer 92 making contacts to the ROIC. Metal interconnects 98 and 100 are deposited through the via holes using a conventional photolithographic lift off process. The circuit details of the ROIC are not shown. Infrared detectors which incorporate ROIC are shown in U.S. Pat. No. 5,179,283 to Cockrum et al. which issued Jan. 12, 1993 and is entitled "INFRARED DETECTOR FOCAL PLANE" and No. 4,970,567 to Ahlgren et al. which issued Nov. 13, 1990 and is entitled "METHOD AND APPARATUS FOR DETECTING INFRARED RADIATION; MONOLITHIC PHOTODETECTOR", and these two issued U.S. patents are incorporated herein by reference.

When in operation, the infrared detector cells, shown in FIGS. 2j and 2k, are electrically biased by a DC signal applied between contacts 70 and 72. This signal is modulated when infrared radiation is absorbed by the active region 42a.

The structures shown in FIG. 2j and FIG. 2k are preferably fabricated as a plurality of elements in an array to form a infrared focal plane array.

In summary, the present invention is a configuration for an infrared detector having isotype heterojunction blocking contacts and a method of fabricating the detector.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

What we claim is:

1. A method for fabrication for an impedance-matched photoconductive infrared detector, comprising the steps of:

forming an infrared active layer which is supported by a growth substrate, forming a carrier blocking layer on a first surface of said active layer, etching said blocking layer to expose a region of said active layer and form first and second regions of said blocking layer, forming an insulating layer on exposed surfaces of said first and second regions of said blocking layer, etching said insulating layer to form respective openings to said first and second blocking layer regions, forming respective ohmic contacts which extend through said openings to said first and second blocking layer regions, forming an infrared transparent spacer layer over said region of said active layer, forming a ground plane over said spacer layer, joining a supporting substrate to at least said ground plane, removing said growth substrate to expose a second surface of said active layer, and etching said second surface of said active layer to form an etched second surface and to produce a reduced thickness for said active layer.

2. The method of fabrication as set forth in claim 1 including the step of forming a passivation layer on said etched second surface of said active layer.

3. The method of fabrication as set forth in claim 2 including the step of depositing respective infrared blocking shields on said passivation layer immediately above said blocking layers to prevent incident infrared radiation from passing through said active layer and striking said first and second regions of said blocking layer.

4. The method of fabrication as set forth in claim 1 wherein the step of forming respective ohmic contacts comprises:

forming respective first contacts to said first and second blocking layer regions opposite said active layer, forming respective second contacts which interface to said first contacts and have a surface for applying external conductors thereto, and forming respective via holes and contacts to interface to a read-out integrated circuit.

5. The method of fabrication as set forth in claim 1 wherein the step of forming respective ohmic contacts comprises:

forming respective contacts to said first and second blocking layer regions opposite said active layer, forming respective contacts which interface to said first contacts and have a surface for applying external conductors thereto, and forming respective via holes and contacts to interface to a read out integrated circuit supporting substrate.

\* \* \* \* \*